United States Patent [19]

Tomotsune

[11] Patent Number: 5,345,117
[45] Date of Patent: Sep. 6, 1994

[54] SYNCHRONOUS SEPARATING CIRCUIT
[75] Inventor: Katsuo Tomotsune, Kanagawa, Japan
[73] Assignee: NEC Corporation, Tokyo, Japan
[21] Appl. No.: 943,481
[22] Filed: Sep. 11, 1992
[30] Foreign Application Priority Data
  Sep. 13, 1991 [JP] Japan .................. 3-234244
[51] Int. Cl.[5] .................. G06G 7/12; H03K 5/153
[52] U.S. Cl. .................. 307/494; 307/359;
  307/350; 328/108; 328/115; 328/116; 348/525
[58] Field of Search .................. 307/359, 350, 494;
  328/108, 115–116; 358/153

[56] References Cited
U.S. PATENT DOCUMENTS
4,064,541 12/1977 Schneider et al. .................. 358/153

FOREIGN PATENT DOCUMENTS
0066177 5/1980 Japan .................. 358/153
0198972 10/1985 Japan .................. 358/153

*Primary Examiner*—Margaret Rose Wambach
*Attorney, Agent, or Firm*—Leydig, Voit & Mayer

[57] ABSTRACT

A synchronous separating circuit in which the output synchronous signal of the circuit does not change is disclosed. The synchronous separating circuit comprises comparator, input capacitor disposed between an input terminal and the non-inverting input of the comparator, switching transistor and a constant current source. The inverting input of the comparator is set at a bias voltage and the output of the comparator controls the switching transistor for charging the non-inverting input of the comparator during a synchronous period at a constant rate. The constant current source discharges the non-inverting input during another period at a constant rate, so that the potential of the non-inverting input does not change. As a result, the period of the synchronous signal separated by the separating circuit does not change. The synchronous separating circuit is suitable for a liquid crystal TV or on-screen-display for a video system.

6 Claims, 7 Drawing Sheets

SYNCHRONOUS SEPARATING CIRCUIT

BACKGROUND OF THE INVENTION

The present invention relates to a synchronous separating circuit, and more particularly to a synchronous separating circuit separating or extracting a synchronous signal from a complex image signal for a TV receiver, a video system or the like.

A synchronous separating circuit functions separation of a synchronous signal from a complex image signal constituting a series of signals each including an analog image signal and a synchronous pulse. The waveform and the potential level of an individual image signal depends on color, brightness or chroma of the image to be transmitted.

The synchronous signal separated by a synchronous separating circuit is utilized, for example, in a TV receiver to determine a timing for displaying the image signals transmitted, i.e. it determines horizontal locations at which series of individual image signals are to be displayed on a TV screen. Generally, a synchronous separating circuit is required to output a signal in which the pulse width or period of the output synchronous signal does not change with time.

Figure 1:
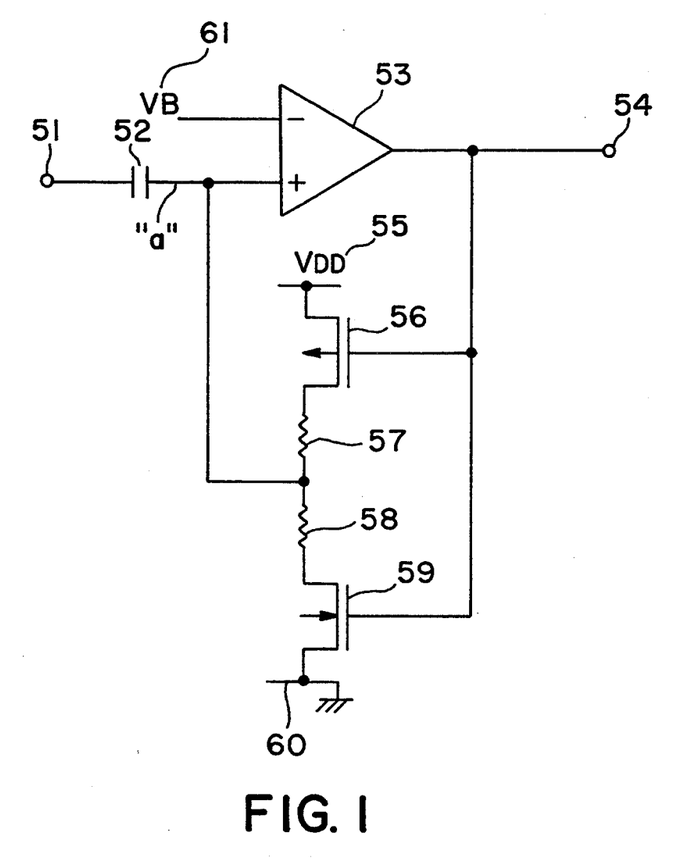
FIG. 1 is a circuit diagram of a conventional synchronous separating circuit.

FIG. 1 shows a conventional synchronous separating circuit for a black-and-white liquid crystal television, in which the separating circuit is constituted by CMOS. The synchronous separating circuit comprises a comparator 53, Pch and Nch MOS transistors 56 and 59, a capacitor 52 and resistors 57 and 58. The input terminal 51 of the synchronous separating circuit is connected to one of the terminals of the capacitor 52, the other terminal of which is connected to a connection point of one of the terminals of the resistor 57 with one of the terminals of the resistor 58 and to the non-inverting input (+) of the comparator 53.

The inverting input (−) of the comparator 53 connected to an electric source 61 of a bias voltage $V_B$, and the output of the comparator 53 is connected to the output terminal 54 of the synchronous separating circuit and to the gates of the Pch MOS transistor 56 and the Nch MOS transistor 59. The source of the Pch MOS transistor 56 is connected to a higher potential electric source 55 of a constant voltage $V_{DD}$, and the drain of the Pch MOS transistor 56 and the other terminal of the resistor 57 are connected to each other. The source of the Nch MOS transistor 59 is connected to a ground 60. The drain of the Nch MOS transistor 59 and the other terminal of the resistor 58 are connected to each other.

Figure 2A:
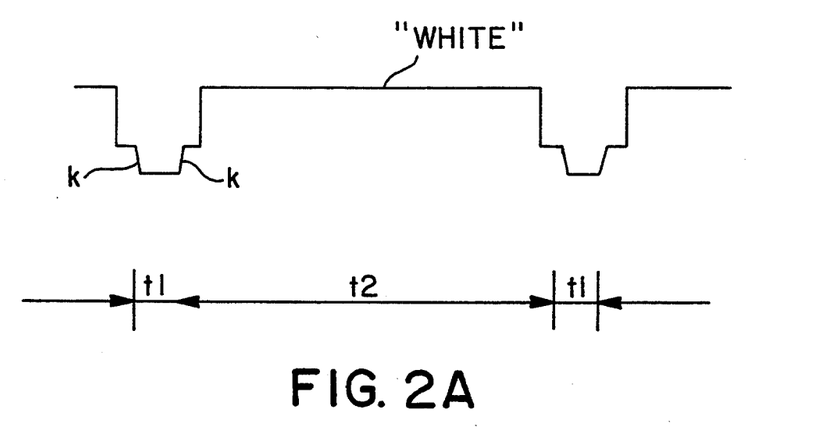
FIGS. 2A and 2B each shows a complex image signal to be inputted to a synchronous separating circuit.
Figure 2B:
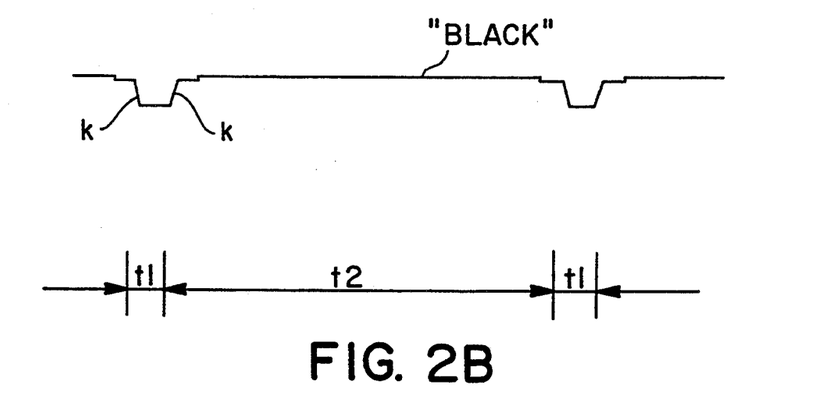

Waveforms of a complex image signal to be inputted to the synchronous separating circuit is shown in FIGS. 2A and 2B in somewhat a simplified manner. The waveform of FIG. 2A shows the complex image signal when the image signal included in the complex image signal represents white, while the waveform of FIG. 2B shows the complex image signal when the image signal represents black. As shown in these drawings, the complex image signal has a period $t_1$ called a synchronous period during which the potential of the signal falls to the minimum and a period $t_2$ during which the potential of the complex image signal has different values for representing the image to be transmitted.

The operation of the circuit of FIG. 1 is as follows: A complex image signal is fed to one of the terminals of the capacitor 52 through the input terminal 51. The potential of the non-inverting input of the comparator 53 follows the complex image signal except the direct current potential thereof. When the potential of the non-inverting input (node "a") falls below the bias voltage $V_B$, the output of the comparator 53 becomes "L", thereby closing the Pch MOS transistor 56 and charging the node "a" during a synchronous period $t_1$. When the potential of node "a" rises above the bias voltage $V_B$, the output of the comparator 53 becomes "H", thereby closing the Nch MOS transistor 59 and discharging from the node "a" through the Nch MOS transistor 59 during a period $t_2$. The output of the comparator 53 is a synchronous signal separated by the synchronous separating circuit. Either of the positive- or negative-going transition of the potential of the synchronous signal is utilized as a timing to display an image signal.

The conventional synchronous separating circuit functions a normal separating operation, when electric charge Q1 stored in the node "a" during the period $t_1$ and electric charge Q2 discharged from the node "a" during the period $t_2$ are equal to each other. Namely, a normal synchronous separation is carried out when the following equation holds.

$$\int_o^{t1} i_C dt = \int_o^{t2} i_D dt$$

wherein $i_C$ and $i_D$ represent a charging current and a discharging current of the node "a", respectively.

However, in a conventional synchronous separating circuit, electric charge discharged from the node "a" during the period $t_2$ depends on the conditions where the image signal is white, gray or black, so that there is a drawback in the conventional synchronous separating circuit in which the width of the synchronous pulse of the output synchronous signal changes depending on the conditions.

SUMMARY OF THE INVENTION

An object of the present invention is to eliminate the drawback described above and provide a synchronous separating circuit constructed in such a way that the width of the synchronous pulse of the synchronous signal separated by the synchronous separating circuit does not depend on the image signal to be transmitted.

According to the present invention there is provided a synchronous separating circuit comprising a comparator, a capacitor, first and second means. The comparator has an inverting input, a non-inverting input fed with a bias voltage, and an output connected to the output terminal of the synchronous separating circuit. One of the terminals of the capacitor is connected to the input terminal of the synchronous separating circuit and the other terminal of the capacitor is connected to the non-inverting input of the comparator.

The first means is controlled by the output of the comparator in such a way that the first means provides the non-inverting input of the comparator with substantially a constant charging current, when the output of the comparator is in a low level. The second means discharges from the non-inverting input of the comparator 53 substantially at a constant rate at least when the output of the comparator 53 is in a high level.

Preferably, the first means is constituted by a constant voltage source, switching means and a load resistance, one of the terminals of the switching means being connected to the constant voltage source.

Preferably, the second means is constituted by a constant current source one of the electrodes of which is connected to the non-inverting input of the comparator and the other electrode of which is connected to a constant voltage source, e.g. a ground.

The constant current source may be implemented by a current mirror circuit including MOS transistors.

According to the synchronous separating circuit of the invention, the charging and discharging currents remains constant by means of the first and the second means during the synchronous period and the other period, respectively. As a result, the period of the synchronous signal obtained by the synchronous separating circuit does not change with time irrespectively of whether an individual image signal included in a complex image signal represents, for example, white, gray or black.

BRIEF DESCRIPTION OF THE DRAWINGS

Other and further objects, features and advantages of the invention will be more apparent from the following description, with reference to the accompanying drawings in which.

DESCRIPTION OF THE PREFERRED EMBODIMENT

Figure 3:
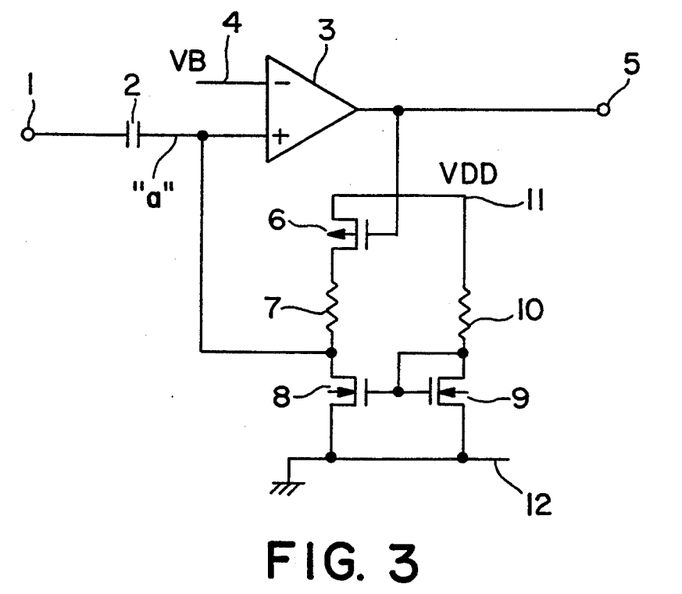
FIG. 3 is an embodiment of a synchronous separating circuit according to the invention.

FIG. 3 is a circuit diagram showing a synchronous separating circuit according to an embodiment of the present invention. In FIG. 3, the synchronous separating circuit for a liquid crystal television comprises a comparator 3, a capacitor 2, an electric source 11 of a constant voltage $V_{DD}$, a switching transistor 6 and a resistor 7, a constant voltage source, i.e. a ground 12, and a constant current source comprising two Nch MOS transistors 8 and 9 and a resistor 10.

The input terminal I of the synchronous separating circuit is connected to one of the terminals of the capacitor 2, the other terminal of which is connected to the non-inverting input of the comparator 3 and to a connection point of one of the terminals of the resistor 7 with tile drain of the Nch MOS transistor 8. The inverting input the comparator 3 is connected to an electric source 4 of a bias voltage $V_B$, and the output of the comparator 3 is connected to an output terminal 5 of the synchronous separating circuit.

The output of the comparator 3 is further connected to the gate of the switching transistor 6 constituted as a Pch MOS transistor, the source of which is connected to a higher potential electric source 11 of a constant voltage $V_{DD}$. The drain of the switching transistor 6 is connected to the other terminal of the resistor 7.

Each of the sources of the Nch MOS transistors 8 and 9 is connected to a ground 12 constituting a lower potential electric source of a constant voltage. The gate and the drain of the Nch MOS transistor 9, the gate of the Nch MOS transistor 8 and one of the terminals of the resistor 10 are connected together. The other terminal of the resistor 10 is connected to the electric source 11.

The operation of the synchronous separating circuit of the embodiment of FIG. 3 is as follows: A complex image signal such as shown in FIGS. 2A and 2B is inputted to the capacitor 2 through the input terminal 1. The potential of the non-inverting input of the comparator 3 follows the complex image signal except its direct current potential, since the capacitance of the capacitor 2 is large compared to the period of the complex image signal.

When the potential of the non-inverting input (node "a") of the comparator 3 falls below the bias voltage $V_B$ during a synchronous period t1, the output of the comparator 3 becomes "L" thereby closing the Pch MOS transistor 6 and charging the node "a" through the Pch MOS transistor 6 during the synchronous period t1. The current of the Pch MOS transistor 6 is a sum of the charging current of the node "a" and the current $I_o$ flowing through the Nch transistor 8.

When the potential of the node "a" rises above the bias voltage $V_B$ during a period t2, the output of the comparator becomes "H", thereby opening the switching transistor 6. The electric charge stored in the node discharges through the Nch MOS transistor 8. The Nch transistors 8 and 9 constitute a current mirror circuit, with the Nch MOS transistor 9 being a reference transistor. The current $I_o$ of the Nch transistor 9 is determined by the resistor 10 and expressed as:

$$I_o = V_{DD}/R_{10}$$

wherein $R_{10}$ is the resistance of the resistor 10. As a result, the discharging current from the node "a" is constant value $I_o$.

Figure 4A:
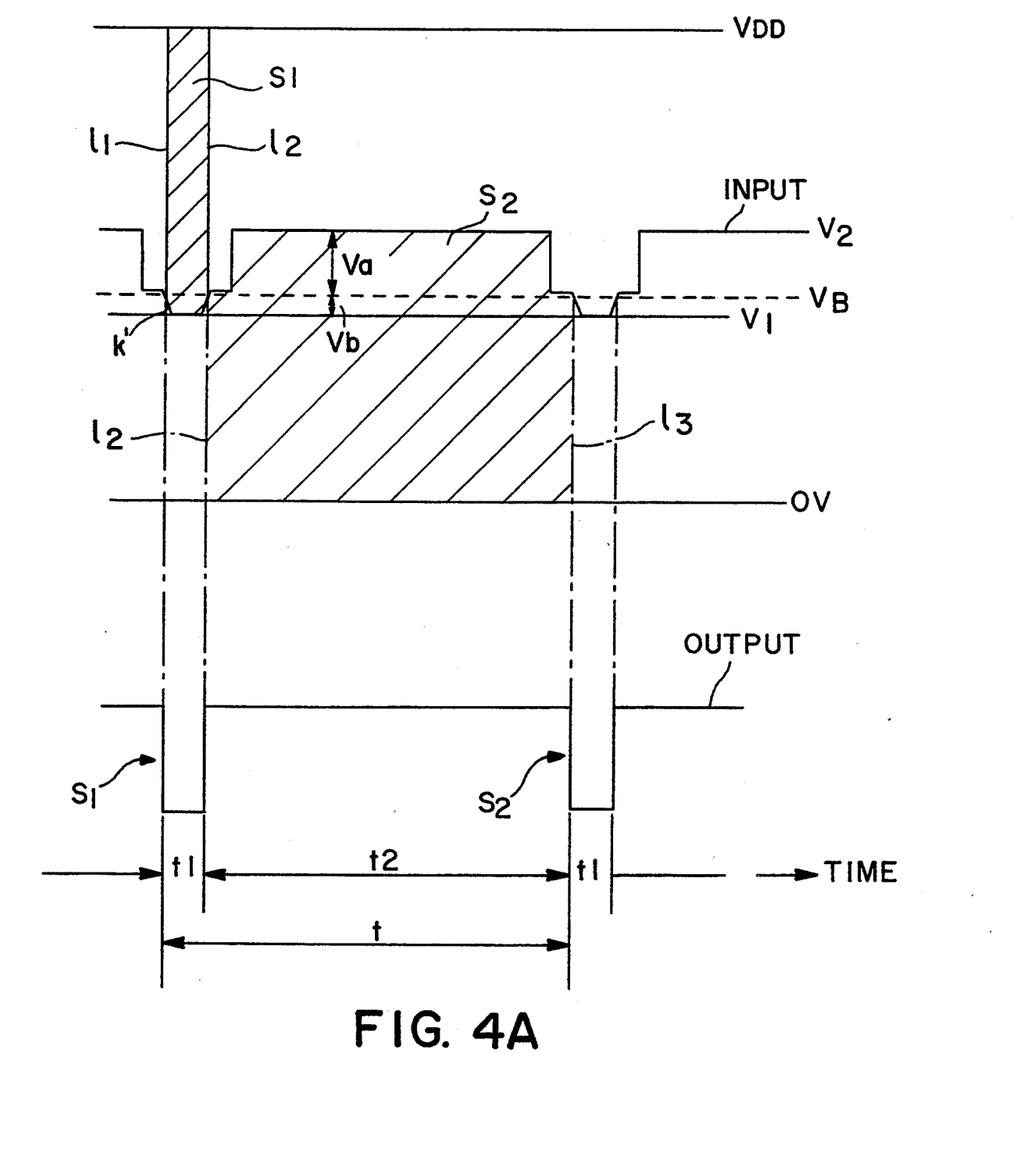
FIGS. 4A and 4B each shows waveforms in the circuit of FIG. 1 for explanation of the function of the conventional synchronous separating circuit.

To help understanding of the detailed function of the present invention, the function of the conventional synchronous separating circuit of FIG. 1 will be now described additionally. FIG. 4A shows a waveform of the node "a" when the image signal is white, which waveform is shown as "input", and a waveform of an output signal obtained from the complex image signal through the synchronous separating circuit of FIG. 1, which waveform is shown as "output". The waveform of "input" is substantially the same as the complex image signal shown in FIG. 2A except its direct current potential.

With the circuit of FIG. 1, the electric charge stored at the node "a" during the period t, and the electric charge Q2 discharged from the node "a" during the period are as follows:

$$Q1 = \int_0^{t1} i_C dt \approx t_1 \cdot \{V_{DD} - (V_B - V_b)\}/R_{57} \quad (1)$$

$$Q2 = \int_0^{t2} i_D dt \approx t_2 \cdot V_2/R_{58} = t_2 \cdot (V_B + V_a)/R_{58} \quad (2)$$

wherein $V_1, V_2, V_a$, and $V_b$ are the potential of the node "a" during the synchronous period $t_1$, the potential of the node "a" during the period $t_2$, difference between $V_B$ and $V_2$, difference between $V_B$ and $V_1$, respectively, as shown in 4A.

The resistor $R_{57}$ and $R_{58}$ of FIG. 1 are so determined that $t_1 = t \cdot R_{57}/(R_{57}+R_{58})$ and $t_2 = t \cdot R_{58}/(R_{57}+R_{58})$ wherein "t" is the sum of the periods $t_1$ and $t_2$. Besides, the voltages $V_{DD}$ and $V_B$ of the electric sources of FIG. 1 are so determined that $$V_{DD}=2\cdot V_B$$

Hence, Q1 and Q2 are expressed as $$Q1=Q2=t\cdot(V_B+V_a)/(R_{57}+R_{58})$$

The electric charge Q1 stored during the period $t_1$ and the electric charge Q2 discharged during the period $t_2$ are equal to each other, so that the direct current potential of the non-inverting input of the comparator 53 does not change with periods "t", irrespectively of the value of $V_a$ which depends on a image signal. Consequently, the conventional synchronous separating circuit of FIG. 1 functions a normal operation in this respect.

In FIG. 4A a shadowed area S1 is shown as surrounded substantially by horizontal lines at VDD and V1 and vertical lines 11 and 12 disposed at the both ends of the period t1. Similarly, a shadowed area S2 is shown as surrounded substantially by horizontal lines at V2 and 0v and vertical lines 12 and 13 disposed at the both ends of the period t2. The charges Q1 and Q2 as described above are proportional to the areas S1 and S2, respectively, as apparent from the equations (1) and (2).

Figure 4B:
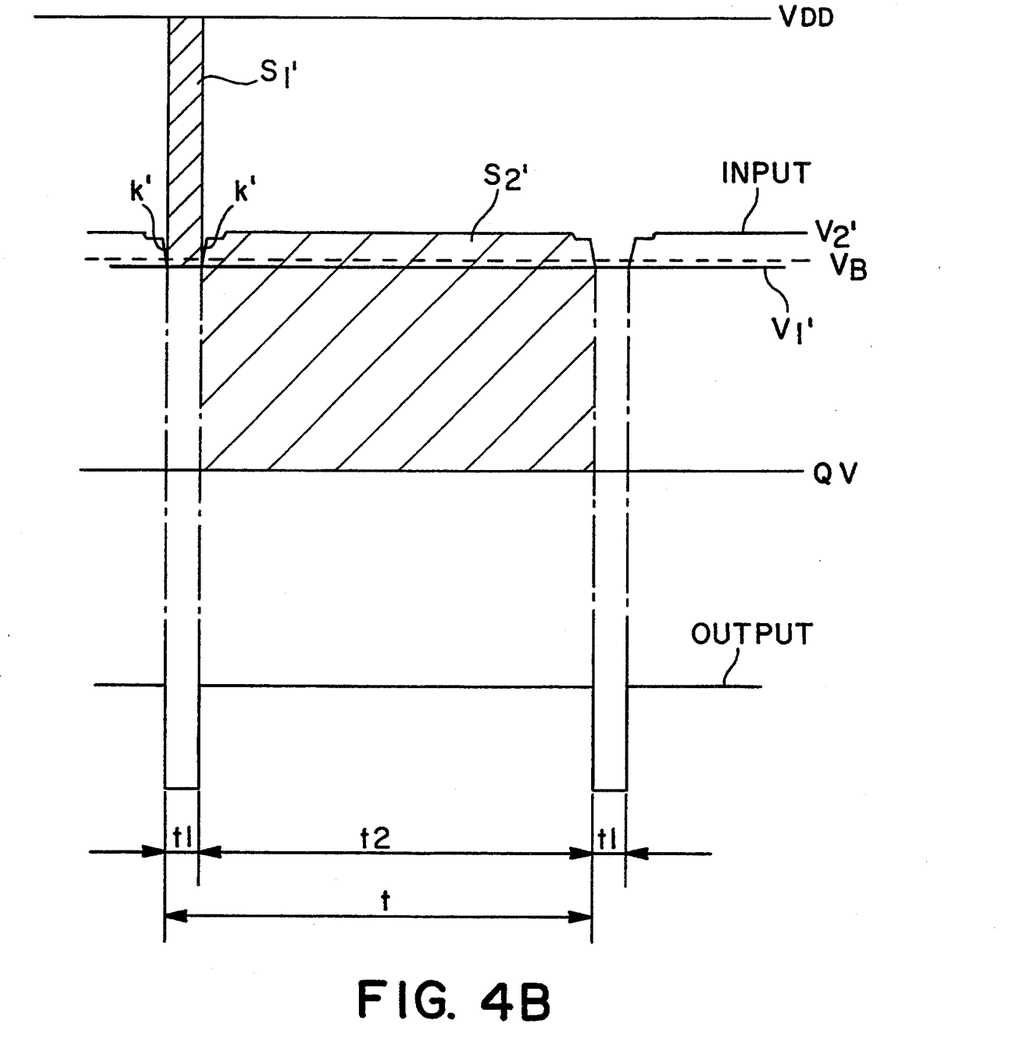

FIG. 4B shows the signals in the separating circuit of FIG. 1 when the image signal is black, likewise FIG. 4A. Shadowed areas S1' and S2' and voltages $V_1'$ and $V_2'$ are shown similarly to the case of the areas S1 and S2 and the voltages $V_1$ and $V_2$ of FIG. 4A, respectively. The areas S1' and S2' correspond to the area S1 and S2 in such a way that $$S1:S2=S1':S2'$$

The are S2' is smaller than the area S2 since the potential $V_2'$ is lower than the potential $V_2$. As a result, The area S1' is smaller than the area S1, so that the potential $V_1'$ becomes closer to the potential $V_B$ than the potential $V_1$ is to $V_B$, as apparent from FIGS. 4A and 4B.

The complex image signal has slope portions "k" at the boundary between the periods $t_1$ and $t_2$, as shown in FIGS. 2A and 2B, due to the characteristics of the transistors involved and distortions during transmissions of the signal. The potential of the node "a" has a similar slope portion in FIG. 4B between the period $t_1'$ and $t_2'$ (also between $t_1$ and $t_2$ in FIG. 4A). Since the potential $V_1'$ is closer to the potential $V_B$, the period $t_1'$ is smaller than the period $t_1$ as a result of the slope portions k'. Consequently, the period "t" of the synchronous signal generated by the conventional separating circuit changes depending on the image signal. With the conventional synchronous separating circuit, the difference between the period $t_1$ and $t_1'$ may be as much as 10 percent of the period "t".

Figure 5A:
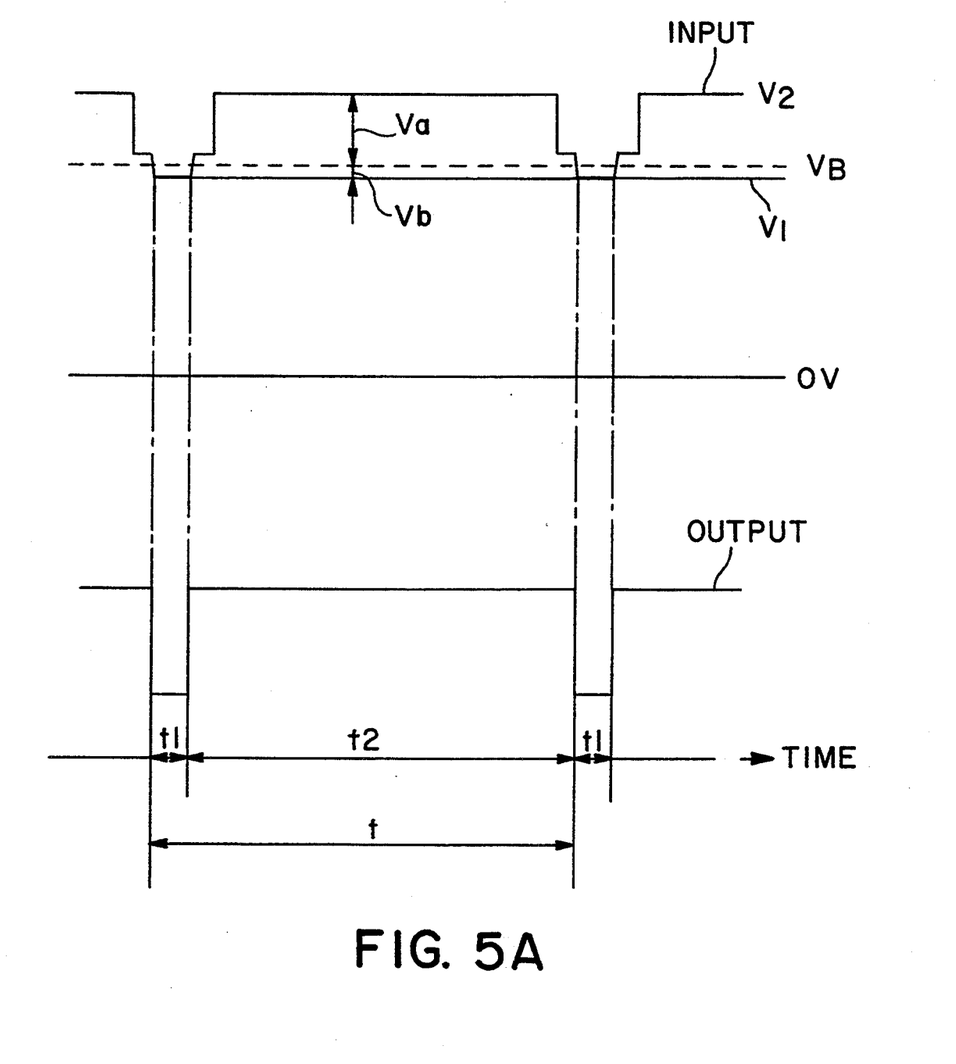
FIGS. 5A and 5B each shows waveforms in the circuit of the embodiment of FIG. 3 for explanation of the function thereof.
Figure 5B:
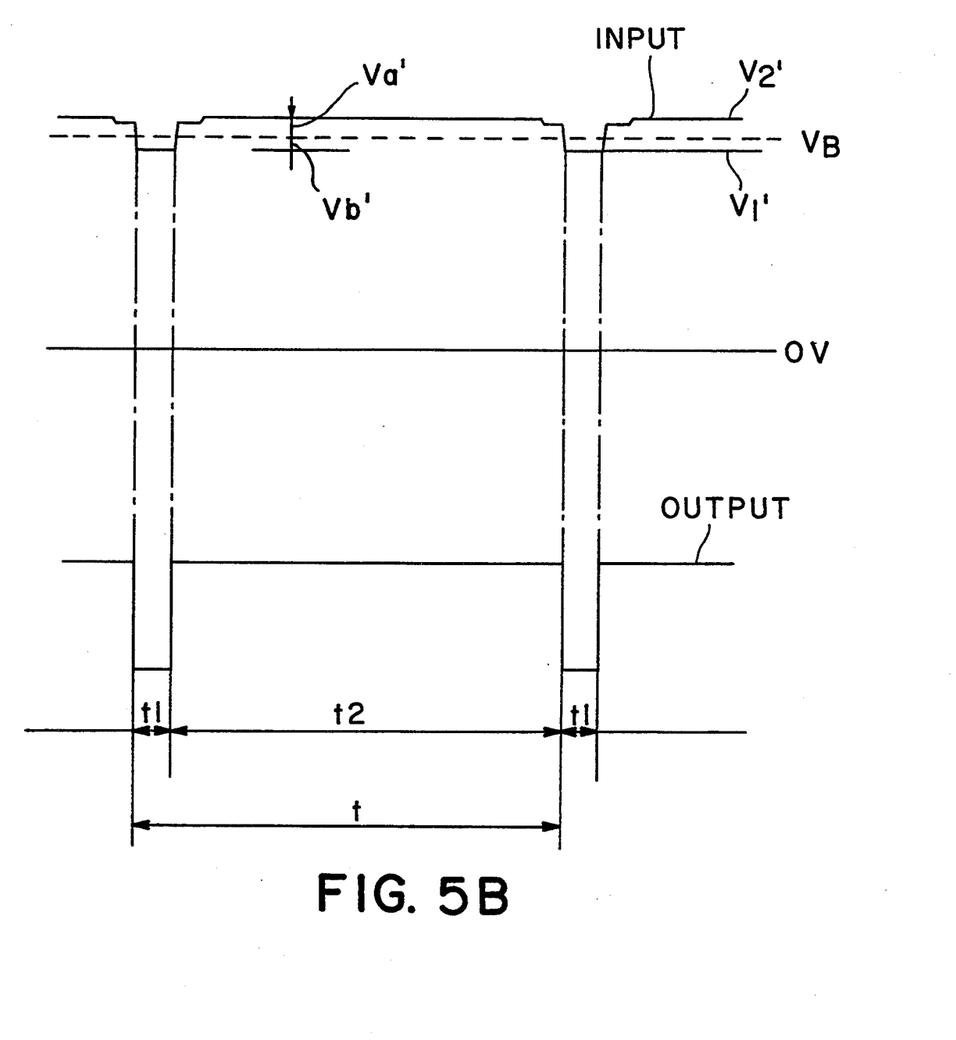

On the other hand, with the synchronous separating circuit of the embodiment of FIG. 3, the charges Q1 and Q2 are constant irrespectively of the image signal and expressed as follows:

$$Q1=t_1\cdot\{V_{DD}-V_B-V_b)\}/R_7 \quad (3)$$

$$Q2=t_2\cdot(V_{DD}-V_{TN})/R_{10} \quad (4)$$

wherein $V_{TN}$, R7 and $R_{10}$ is the threshold voltage of the Nch MOS transistors 8 and 9, the resistance of the resistor 7 and the resistance of the resistor 10, respectively. As is appreciated from these equations (3) and (4), the electric charges Q1 and Q2 do not depend on the voltage $V_a$ which depends on the image to be transmitted. Consequently, the potential $V_1(V_1')$ does not depend on the signal to be transmitted as shown in FIGS. 5A and 5B, which show waveforms in the circuit of FIG. 3 likewise FIGS. 4A and 4B, and remains constant. As a result, the voltage $V_b$ ($V_b'$) does not depend on the signal, and the pulse width $t_1(t_1')$ of the synchronous signal does not depend on the signal to be transmitted as shown in FIGS. 5A and 5B. The difference of the pulse width "t" between periods of the output signal can be reduced to a value smaller than 1 percent of "t".

According to the synchronous separating circuit of the embodiment, since the pulse width of the output synchronous signal does not change, individual image signal can be displayed at the correct horizontal position when it is used in a TV receiver, so that the image displayed on a screen is correct.

In FIG. 3, the current $I_o$ of the current source is at an order of tens of $\mu A$ and the current required to operate the comparator is at an order of hundreds of $\mu A$, so that an increase of dissipation power due to the current $I_o$ is not a problem.

The constant current source, MOS transistors of the above embodiment can be modified as is apparent to those in the art.

The synchronous separating circuit according to the invention is especially suitable for a liquid crystal television in which power dissipation is required at a minimum. The synchronous separating circuit of the invention is also suitable for an on-screen-display (OSD) function in a television or a video system for displaying a message or characters on a screen.

Since above embodiment is described only for an example, the present invention is not limited to such embodiment and it will be obvious for those skilled in the art that various modifications or alterations can be easily made based on the above embodiment under the scope of the invention.

What is claimed is:

1. A synchronous separating circuit comprising:
    a comparator having an inverting input maintained at a bias voltage, a non-inverting input and an output;
    a capacitor having an electrode connected to said non-inverting input;
    first means for providing substantially a constant current to said non-invertinginput when said output of the comparator is in a low level;
    second means for discharging from said non-inverting input at substantially a constant rate at least when said output of said comparator is in a high level wherein said second means includes a current mirror circuit.

2. A synchronous separating circuit comprising:
    a comparator having an inverting input maintained at a bias voltage, a non-inverting input, and an output;
    a capacitor having a first electrode connected to said non-inverting input and a synchronous signal input into a second electrode;
    a first circuit providing a substantially constant current to said non-inverting input when said output of the comparator is at a low level;
    a second circuit including a constant current source for discharging from said non-inverting input at a substantially constant rate at least when said output of said comparator is in a high level, wherein the second circuit includes a constant "voltage source".

3. A synchronous separating circuit comprising:
a comparator having an inverting input maintained at a bias voltage, a non-inverting input, and an output;
a capacitor having a first electrode connected to said non-inverting input and a synchronous signal input into a second electrode;
a first circuit providing a substantially constant current to said non-inverting input when said output of the comparator is at a low level;
a second circuit including a constant current source for discharging from said non-inverting input at a substantially constant rate at least when said output of said comparator is in a high level, wherein the second circuit includes a current "mirror circuit."

4. A synchronous separating circuit comprising:
a comparator having a first input node supplied with a bias voltage, a second input node, and an output node;
a signal input terminal receiving a composite video signal;
a capacitor connected between said signal input terminal and said second input node of said comparator;
a first transistor connected between a first voltage line and said second input node of said comparator and controlled by an output signal at said output node of said comparator such that said first transistor is rendered conductive to charge said capacitor when said output signal takes a first logic level and non-conductive to stop charging said capacitor when said output signal takes a second logic level;
a second transistor connected between a second voltage line and said second input node of said comparator; and
a bias circuit coupled to said second transistor to bias said second transistor such that said second transistor flows a substantially constant current therethrough irrespective of said output signal at said output node of said comparator.

5. The circuit as claimed in claim 4 wherein said first transistor is a field effect transistor of a first channel type and said second transistor is a field effect transistor of a second channel type.

6. The circuit as claimed in claim 5 wherein said bias circuit includes a third transistor cooperating with said second transistor to form a current mirror, said third transistor being a field effect transistor of said second channel type.

* * * * *